United States Patent
Zhao et al.

(10) Patent No.: US 12,289,965 B2
(45) Date of Patent: Apr. 29, 2025

(54) DISPLAY SUBSTRATE AND TEST METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jiping Zhao, Beijing (CN); Mengmeng Du, Beijing (CN); Xiangdan Dong, Beijing (CN); Hongwei Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 694 days.

(21) Appl. No.: 17/434,972

(22) PCT Filed: Mar. 31, 2020

(86) PCT No.: PCT/CN2020/082472
§ 371 (c)(1),
(2) Date: Aug. 30, 2021

(87) PCT Pub. No.: WO2021/195974
PCT Pub. Date: Oct. 7, 2021

(65) Prior Publication Data
US 2022/0328598 A1   Oct. 13, 2022

(51) Int. Cl.
*H10K 59/131*   (2023.01)
*G09G 3/00*   (2006.01)
*H10K 59/35*   (2023.01)

(52) U.S. Cl.
CPC .......... *H10K 59/131* (2023.02); *G09G 3/006* (2013.01); *H10K 59/353* (2023.02); *G09G 2310/0297* (2013.01); *G09G 2330/04* (2013.01)

(58) Field of Classification Search
CPC ... G09G 3/006; G09G 2330/12; H10K 59/131
See application file for complete search history.

(56) References Cited

U.S. PATENT DOCUMENTS

| | | | |
|---|---|---|---|
| 6,362,643 | B1 | 3/2002 | Kim |
| 9,595,213 | B2 | 3/2017 | Kim |

(Continued)

FOREIGN PATENT DOCUMENTS

| | | | |
|---|---|---|---|
| CN | 101515442 A | | 8/2009 |
| CN | 102968946 A | * | 3/2013 |

(Continued)

OTHER PUBLICATIONS

The Extended European Search Report dated Mar. 29, 2023; Appln. No. 20920751.3.

*Primary Examiner* — Bryan R Junge
*Assistant Examiner* — Mario Andres Autore, Jr.
(74) *Attorney, Agent, or Firm* — Frank Gao, Esq.

(57) ABSTRACT

A display substrate and a test method thereof are disclosed. The display substrate includes a base substrate, data lines, data leads, a first test circuit and a second test circuit. A display region of the base substrate includes a pixel array, and the pixel array includes a plurality of sub-pixels; the first test circuit is configured to apply a first test signal to the plurality of sub-pixels to perform a first test in a first test stage; the second test circuit is configured to apply a second test signal to the plurality of sub-pixels to perform a second test in a second test stage. The first test circuit includes a first test switch circuit and a first test control signal application circuit, a first test control signal pad and a first test control (Continued)

signal bypass are respectively electrically connected to a control terminal of the first test switch circuit.

19 Claims, 6 Drawing Sheets

(56) References Cited

U.S. PATENT DOCUMENTS

| | | | |
|---|---|---|---|
| 10,043,429 B2 | 8/2018 | Zhou | |
| 11,957,016 B2* | 4/2024 | Kwak | H10K 71/70 |
| 2008/0054798 A1* | 3/2008 | Jeong | G09G 3/3225 |
| | | | 324/403 |
| 2011/0043499 A1* | 2/2011 | Cok | H10K 71/70 |
| | | | 345/82 |
| 2012/0249458 A1* | 10/2012 | Okazaki | G06F 3/0446 |
| | | | 345/173 |
| 2015/0084666 A1 | 3/2015 | Kim et al. | |
| 2016/0240120 A1 | 8/2016 | Du | |
| 2016/0356834 A1* | 12/2016 | Yoon | G01R 29/26 |
| 2017/0269398 A1* | 9/2017 | Park | H01L 27/1244 |
| 2019/0236993 A1* | 8/2019 | Wang | H10K 71/70 |
| 2020/0152881 A1* | 5/2020 | Cho | G01R 31/2601 |
| 2021/0181888 A1* | 6/2021 | Yan | G06F 3/0445 |
| 2021/0183282 A1* | 6/2021 | Jiang | G06F 1/184 |
| 2022/0077273 A1* | 3/2022 | Qing | H01L 27/0248 |
| 2023/0134900 A1* | 5/2023 | Fan | G09G 3/3225 |
| | | | 345/214 |

FOREIGN PATENT DOCUMENTS

| | | |
|---|---|---|
| CN | 104217672 A | 12/2014 |
| CN | 104992651 A | 10/2015 |

* cited by examiner

DISPLAY SUBSTRATE AND TEST METHOD THEREOF

CROSS-REFERENCE TO RELATED APPLICATIONS

This application is a national stage entry of International Application No. PCT/CN2020/082472 filed on Mar. 31, 2020. The entire disclosures of the above applications are incorporated herein by reference.

TECHNICAL FIELD

Embodiments of the present disclosure relate to display substrate and a test method thereof.

BACKGROUND

In the display industry, with the continuous development of display technology, the market requirement for flexible organic light-emitting diode (OLED) display panels is growing. The general manufacturing process of an OLED display panel usually includes an array manufacturing process, a light-emitting material evaporation process, a cutting process, and a module assembly process. Before performing the cutting process of an OLED display substrate, a performance test of the display substrate is required. As an important test method of transistor characteristics, an array test (AT) method is widely used in the manufacturing process of the OLED display substrate. The test principle of array test is to use a test probe of an array test device to contact an array test pad of a bonding region of the display substrate and apply an array test signal, in order to detect characteristics of transistors and the like of a pixel circuit of the display substrate. After the array test is performed, the OLED display substrate is further subjected to an lighting test (ET) to test the performance of the pixel array of the display substrate while displaying black and white bar images, monochrome images and grayscale images, so as to provide the level of display performance, and then improve the product yield.

SUMMARY

At least one embodiment of the present disclosure provides a display substrate, comprising: a base substrate, a plurality of data lines, a plurality of data leads, a first test circuit, and a second test circuit. The base substrate comprises a display region and a peripheral region, wherein the peripheral region is located on at least one side of the display region, the display region comprises a pixel array, and the pixel array comprises a plurality of sub-pixels; the plurality of data lines are located in the display region and configured to be respectively electrically connected to the plurality of sub-pixels to respectively provide a data signal to the plurality of sub-pixels; the plurality of data leads are located in the peripheral region and respectively electrically connected to the plurality of data lines; the first test circuit is located in the peripheral region and located on a side of the plurality of data leads away from the display region, and electrically connected to the plurality of data leads, wherein the first test circuit is configured to apply a first test signal to the plurality of sub-pixels to perform a first test in a first test stage; and the second test circuit is electrically connected to the first test circuit and the plurality of data leads, wherein the second test circuit is configured to apply a second test signal to the plurality of sub-pixels to perform a second test in a second test stage, wherein the first test circuit comprises a first test switch circuit and a first test control signal application circuit, the first test control signal application circuit comprises a first test control signal pad and a first test control signal bypass, the first test control signal pad and the first test control signal bypass are respectively electrically connected to a control terminal of the first test switch circuit, and the first test control signal bypass is configured to be electrically connected to an external signal application circuit.

For example, in the display substrate provided by an embodiment of the present disclosure, the first test switch circuit comprises a first test switch transistor and a first test control signal line, the first test control signal pad is electrically connected to a gate electrode of the first test switch transistor through the first test control signal line, and the gate electrode of the first test switch transistor is used as the control terminal of the first test switch circuit; and the first test control signal bypass comprises a first voltage division circuit, a first terminal of the first voltage division circuit is electrically connected to the first test control signal line, and a second terminal of the first voltage division circuit is electrically connected to the external signal application circuit.

For example, in the display substrate provided by an embodiment of the present disclosure, the first test control signal bypass further comprises at least one first electrostatic discharge unit, the at least one first electrostatic discharge unit is located on a side of the first test control signal pad close to the first test switch circuit, the first test control signal pad is electrically connected to the first electrostatic discharge unit, and the first voltage division circuit is located on a side of the first electrostatic discharge unit away from the first test control signal pad and is electrically connected to the first electrostatic discharge unit.

For example, in the display substrate provided by an embodiment of the present disclosure, the first voltage division circuit comprises at least one first resistor, a first terminal of the at least one first resistor is electrically connected to a data signal input terminal of the at least one first electrostatic discharge unit, and a second terminal of the at least one first resistor is electrically connected to the first test control signal line through a data signal transmission line.

For example, in the display substrate provided by an embodiment of the present disclosure, the at least one first resistor comprises a plurality of first resistors, the at least one electrostatic discharge unit comprises a plurality of first electrostatic discharge units, the first terminal of each of the plurality of first resistors is electrically connected to each of the plurality of first electrostatic discharge units, and the plurality of first electrostatic discharge units are arranged side by side; and the second terminal of each of the plurality of first resistors is electrically connected to the first test control signal line, and a plurality of the first test control signal lines connected to the plurality of first resistors are respectively electrically connected to the gate electrode of the first test switch transistor.

For example, in the display substrate provided by an embodiment of the present disclosure, a total number of the plurality of first resistors, a total number of the plurality of first test control signal lines, and a total number of the plurality of first electrostatic discharge units are equal to each other, first terminals of the plurality of first resistors are electrically connected to the plurality of first electrostatic discharge units in one-to-one correspondence, and second terminals of the plurality of first resistors are electrically connected to the plurality of first test control signal lines in one-to-one correspondence.

For example, in the display substrate provided by an embodiment of the present disclosure, the first test switch transistor is a P-type thin film transistor or an N-type thin film transistor, and the external signal application circuit is used for applying a control signal voltage for turning off the first test switch transistor, so that the second test circuit is capable of turning off the first test switch circuit when the second test circuit is working.

For example, in the display substrate provided by an embodiment of the present disclosure, the second test circuit comprises at least one voltage application signal pad, the at least one voltage application signal pad is electrically connected to the first test control signal bypass, and the at least one voltage application signal pad is used to electrically connect to the external signal application circuit in the second test stage; and the first test control signal bypass is configured to receive the control signal voltage and apply the control signal voltage for turning off the first test switch transistor to the first test switch circuit.

For example, in the display substrate provided by an embodiment of the present disclosure, the first test control signal application circuit further comprises a first test signal pad, a first electrode of the first test switch transistor is electrically connected to the plurality of sub-pixels, and a second electrode of the first test switch transistor is configured to be electrically connected to the first test signal pad.

For example, in the display substrate provided by an embodiment of the present disclosure, the second test circuit comprises at least one second test switch circuit, a first terminal of the second test switch circuit is connected to the plurality of sub-pixels, a second terminal of the second test switch circuit is configured to receive the second test signal, and a control terminal of the second test switch circuit is configured to receive a second test control signal.

For example, in the display substrate provided by an embodiment of the present disclosure, the second test circuit further comprises at least one second test signal pad and at least one second test control signal pad, the first terminal of the second test switch circuit is configured to be connected to the plurality of sub-pixels to provide the second test signal, the second terminal of the second test switch circuit is configured to be electrically connected to the second test signal pad to receive the second test signal, and the control terminal of the second test switch circuit is configured to be electrically connected to the second test control signal pad to receive the second test control signal.

For example, in the display substrate provided by an embodiment of the present disclosure, the second test circuit further comprises a test signal line, the test signal line is electrically connected to the plurality of sub-pixels, and the test signal line is further electrically connected to the first terminal of the second test switch circuit to receive the second test signal, and then the second test signal is transmitted to the plurality of sub-pixels.

For example, in the display substrate provided by an embodiment of the present disclosure, the test signal line is further electrically connected to the first test circuit to transmit the first test signal to the plurality of sub-pixels.

For example, in the display substrate provided by an embodiment of the present disclosure, the at least one second test switch circuit comprises a plurality of second test switch circuits, first terminals of the plurality of second test switch circuits are electrically connected to the plurality of sub-pixels respectively through the test signal line, and the plurality of second test switch circuits are located in a same column.

For example, in the display substrate provided by an embodiment of the present disclosure, the pixel array further comprises a first multiplex selection circuit, the first multiplex selection circuit comprises a first terminal, a second terminal, a third terminal, and at least one control terminal, and the first multiplex selection circuit is configured to electrically connect the first terminal of the first multiplex selection circuit and the third terminal of the first multiplex selection circuit or electrically connect the second terminal of the first multiplex selection circuit and the third terminal of the first multiplex selection circuit according to a control signal received by the at least one control terminal; and the first terminal of the first multiplex selection circuit is electrically connected to a plurality of sub-pixels located in a first column, the second terminal of the first multiplex selection circuit is electrically connected to a plurality of sub-pixels located in a second column, and the third terminal of the first multiplex selection circuit is electrically connected to each of the first test circuit and the second test circuit.

For example, in the display substrate provided by an embodiment of the present disclosure, the plurality of sub-pixels located in the first column comprise a first sub-pixel and a second sub-pixel adjacent to each other, the first sub-pixel emits light of a first primary color, and the second sub-pixel emits light of a second primary color; and the plurality of sub-pixels located in the second column comprise a third sub-pixel and a fourth sub-pixel adjacent to each other, and the third sub-pixel and the fourth sub-pixel emit light of a third primary color, wherein the first sub-pixel, the second sub-pixel, the third sub-pixel, and the fourth sub-pixel constitute a pixel unit.

At least one embodiment of the present disclosure provides a test method for a display substrate, comprising: in a first test stage, preforming a first test on a plurality of sub-pixels of a pixel array by using a first test circuit; and in a second test stage, performing a second test on the plurality of sub-pixels by using a second test circuit, and simultaneously applying a control signal voltage by using an external signal application circuit to apply a control signal voltage to a first test switch circuit of the first test circuit through a first test control signal bypass to cause the first test switch circuit to be in an off state.

For example, the test method provided by an embodiment of the present disclosure further comprises: in the second test stage, electrically connecting the external signal application circuit and a voltage application signal pad of the second test circuit; and transmitting the control signal voltage to the first test control signal bypass, wherein the voltage application signal pad is electrically connected to the first test control signal bypass.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
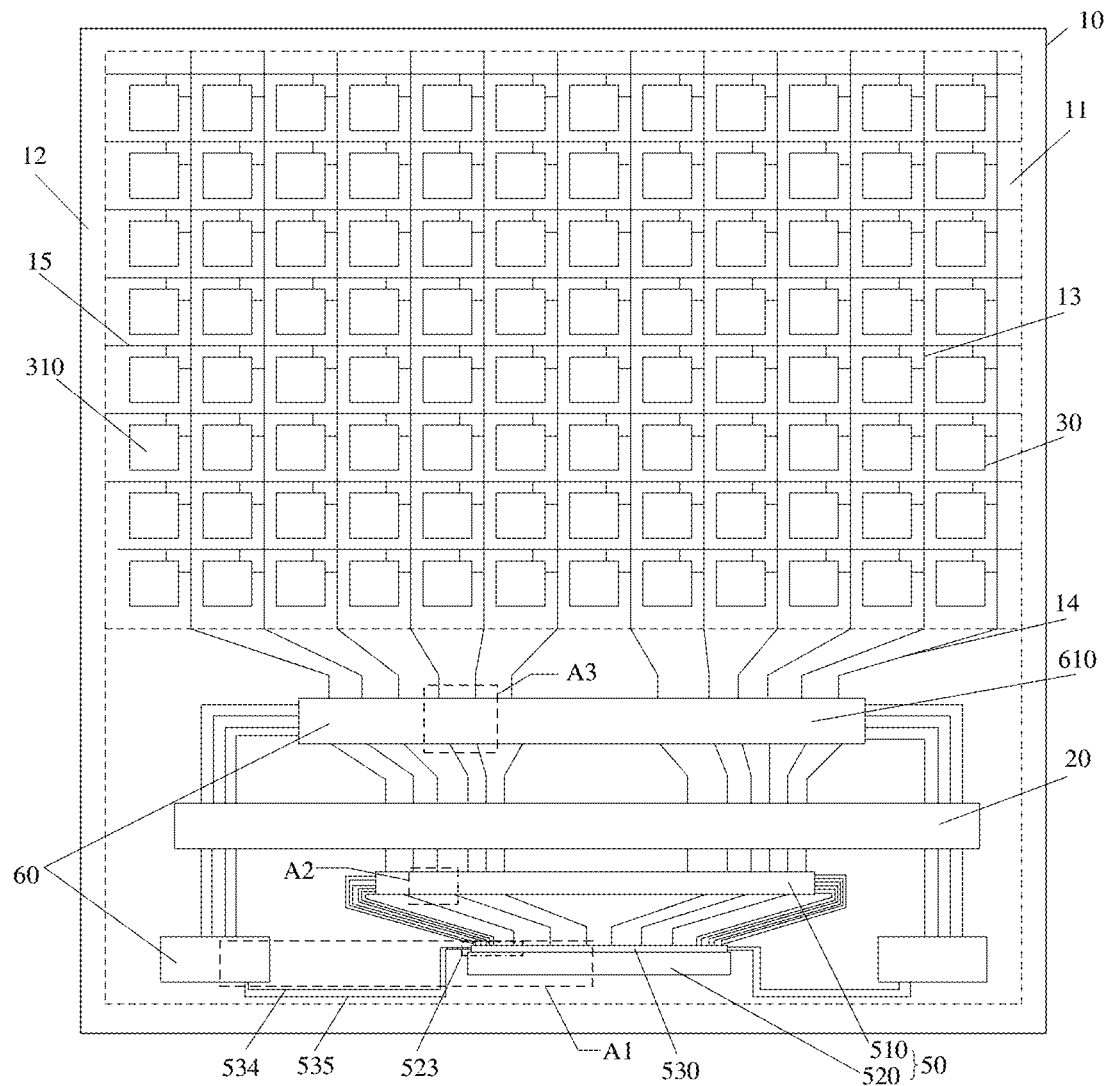
FIG. 1 is a schematic diagram of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Similarly, the terms "a," "an," or "the," etc., are not intended to indicate a quantity limit, but indicate at least one. The terms "comprises," "comprising," "includes," "including," etc., are intended to specify that the elements or the objects stated before these terms encompass the elements or the objects and equivalents thereof listed after these terms, but do not preclude the other elements or objects. For the convenience of description, "on," "under," "front," and "back" are shown in some drawings. In the embodiments of the present disclosure, the vertical direction is the direction from top to bottom or from bottom to top, thus, the vertical direction is for example along the direction of gravity. The horizontal direction is the direction perpendicular to the vertical direction, and the horizontal direction is from right to left, or from front to back.

During an array test of a display substrate, an array test device transmits a test signal to an array test pad through a test probe connected to the array test pad. The array test pad is electrically connected to a switch circuit that controls the array test, and the switch circuit for the array test is electrically connected to a plurality of sub-pixels in a display region. The array test pad transmits the test signal to the plurality of sub-pixels in the display region for testing through the switch circuit that controls the array test. Before a display panel undergoes a module assembly process, the switch circuit for the array test used in the array test stage is still retained in the display substrate. During the subsequent lighting test stage of the display substrate, the gate control signal of the transistor of the switch circuit that controls the array test is in a floating state, which will cause data signals of different columns of the switch circuit to crosstalk with each other, resulting in the phenomenon of vertical dark stripes in the display region, which affects the accuracy of the lighting test of the display panel and further affects the product yield of the display panel.

At least one embodiment of the present disclosure provides a display substrate, and the display substrate includes a base substrate, a plurality of data lines, a plurality of data leads, a first test circuit, and a second test circuit. The base substrate includes a display region and a peripheral region, the peripheral region is located on at least one side of the display region, the display region includes a pixel array, and the pixel array includes a plurality of sub-pixels. The plurality of data lines are located in the display region and configured to be respectively electrically connected to the plurality of sub-pixels to respectively provide a data signal to the plurality of sub-pixels. The plurality of data leads are located in the peripheral region and respectively electrically connected to the plurality of data lines. The first test circuit is located in the peripheral region and located on a side of the plurality of data leads away from the display region, the first test circuit is electrically connected to the plurality of data leads, and the first test circuit is configured to apply a first test signal to the plurality of sub-pixels to perform a first test in a first test stage. The second test circuit is electrically connected to the first test circuit and the plurality of data leads, and the second test circuit is configured to apply a second test signal to the plurality of sub-pixels to perform a second test in a second test stage. The first test circuit includes a first test switch circuit and a first test control signal application circuit, the first test control signal application circuit includes a first test control signal pad and a first test control signal bypass, the first test control signal pad and the first test control signal bypass are respectively electrically connected to a control terminal of the first test switch circuit, and the first test control signal bypass is configured to be electrically connected to an external signal application circuit.

In the display substrate provided by the above-described embodiment, the first test control signal bypass is electrically connected to the control terminal of the first test switch circuit and electrically connected to the external signal application circuit. In the second test stage, the external signal application circuit applies a control signal voltage, that can turn off the first test switch circuit, to the first test switch circuit through the first test control signal bypass to turn off the first test switch circuit in the second test stage, thereby eliminating the crosstalk phenomenon of signals between different columns of the first test switch circuit caused by the control signal of the first test switch circuit being in a floating state and further eliminating the problem of vertical dark stripes in the display region, which is beneficial to improve the accuracy of the array test of the display panel and the product yield of the display panel.

At least one embodiment of the present disclosure further provides a test method suitable for the above-described display substrate. The test method includes: in a first test stage, performing a first test on a plurality of sub-pixels of a pixel array by using a first test circuit; and in a second test stage, performing a second test on the plurality of sub-pixels by using a second test circuit, and simultaneously applying a control signal voltage by using an external signal application circuit to a first test switch circuit of the first test circuit through a first test control signal bypass to cause the first test switch circuit to be in an off state.

The embodiments and examples of the present disclosure will be described in detail below with reference to the accompanying drawings.

Figure 2A:
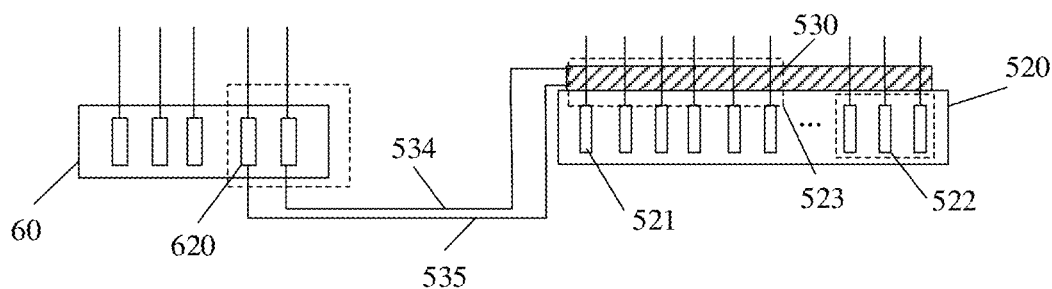
FIG. 2A is an enlarged schematic diagram of an area A1 in FIG. 1 provided by an embodiment of the present disclosure.
Figure 2B:
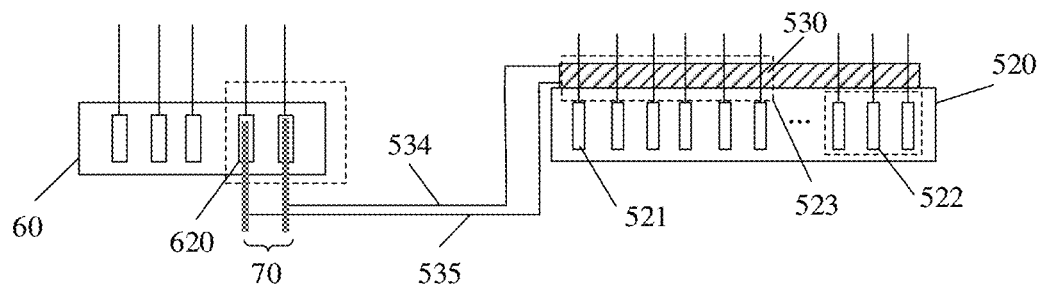
FIG. 2B is an enlarged schematic diagram of the area A1 in FIG. 1 in a second test stage provided by an embodiment of the present disclosure.

For example, FIG. 1 is a schematic diagram of a display substrate provided by an embodiment of the present disclosure; FIG. 2A is an enlarged schematic diagram of an area A1 in FIG. 1 provided by an embodiment of the present disclosure; and FIG. 2B is an enlarged schematic diagram of the area A1 in FIG. 1 in a second test stage provided by an embodiment of the present disclosure.

As illustrated in FIG. 1, the display substrate includes a base substrate 10. The display substrate is, for example, a motherboard after the pixel array is manufactured during the manufacturing process and before the cutting process is performed. After the test process is performed on the display substrate, circuit units, connecting lines, etc., used in the test stage are cut off to manufacture the display panel for the final product.

As illustrated in FIG. 1, the base substrate 10 includes a display region 11 and a peripheral region 12. The peripheral region 12 is located on at least one side of the display region 11. For example, the peripheral region 12 surrounds the display region 11 and occupies the largest area (the area where the most circuit units, connecting lines, etc., are arranged) below the display region 11. The display region 11 includes a pixel array 30, and the pixel array 30 includes a plurality of sub-pixels 310 for performing the display function of the display region 11. For example, the plurality of sub-pixels 310 are arranged in an array, including a plurality of rows and a plurality of columns.

As illustrated in FIG. 1, the display substrate further includes a plurality of data lines 13 located in the display region 11, and the plurality of data lines 13 are configured to be electrically connected to the sub-pixels 310 in the plurality of columns respectively, to respectively provide data signals to the sub-pixels 310 in the plurality of columns, so as to control and drive the plurality of sub-pixels 310 to realize an image display. For example, each of the plurality of data lines 13 is connected to the sub-pixels 310 located in the same column (for example, the column direction refers to a vertical direction in FIG. 1). The display substrate further includes a plurality of data leads 14 located in the peripheral region 12, and the plurality of data leads 14 are respectively electrically connected to the plurality of data lines 13 in one-to-one correspondence. That is, one terminal of the data lead 14 close to the display region 11 is electrically connected to the data line 13, and the other terminal of the data lead 14 away from the display region 11 extends to a side of the peripheral region 12 away from the display region 11 to connect other circuits in the peripheral region 12, so that signals from other circuits, such as data signals, are applied to the plurality of sub-pixels 310.

For example, continuing as illustrated in FIG. 1, the display substrate further includes a plurality of gate lines 15 located in the display region 11 extending in a horizontal direction and configured to provide scanning signals to the pixel array. The plurality of gate lines 15 are connected to the pixel array 30. For example, each of the plurality of gate lines 15 is connected to the sub-pixels 310 of the pixel array 30 located in the same row.

Continuing as illustrated in FIG. 1, the display substrate further includes a first test circuit 50 and a second test circuit 60 located in the peripheral region 12.

The first test circuit 50 is located on a side of the plurality of data leads 14 away from the display region 11 and is electrically connected to the plurality of data leads 14. The first test circuit 50 is configured to apply a first test signal to the plurality of sub-pixels 310 through the plurality of data leads 14 in a first test stage (i.e., the array test) to perform a first test. For example, the first test signal is a data signal, which can be used to detect the performance of the pixel circuit of the sub-pixel of the display substrate.

The second test circuit 60 is electrically connected to the plurality of data leads 14 and thus is electrically connected to the first test circuit 50. The second test circuit 60 is configured to apply a second test signal to the plurality of sub-pixels 310 through the plurality of data leads 14 in a second test stage (i.e., the lighting test) to perform a second test. For example, the second test signal is also a data signal, and the plurality of sub-pixels 310 receive the second test signal to display at least one second test image, so as to test the performance of the pixel array 30 of the display substrate while displaying black and white bar images, monochrome images and grayscale images.

Because the first test circuit 50 and the second test circuit 60 are both electrically connected to the plurality of data leads 14, it is necessary to avoid the crosstalk between the first test circuit 50 and the second test circuit 60 in the first test stage and the second test stage. For example, the first test circuit 50 and the second test circuit 60 each include a switch circuit and a test signal application circuit; and an external signal application circuit and the data lead 14 are controlled to be electrically connected or disconnected with each other by using the switch circuit.

The display substrate further includes a signal access unit 20 located on a side of the first test circuit 50 close to the display region 11. The signal access unit 20 is electrically connected to the first test circuit 50 and the plurality of data leads 14 to receive the data signal from the first test circuit 50, and to apply the received signal of the first test circuit 50, such as the data signal, to the plurality of sub-pixels 310 through the plurality of data leads 14 respectively. For example, the signal access unit 20 includes a plurality of access pads for bonding to a flexible printed circuit (FPC).

As illustrated in FIG. 1, the first test circuit 50 includes a first test switch circuit 510 and a first test control signal application circuit 520. The first test switch circuit 510 is located between the signal access unit 20 and the first test control signal application circuit 520, and the first test control signal application circuit 520 is electrically connected to the first test switch circuit 510. The first test control signal application circuit 520 is used to apply a control signal to control the first test switch circuit 510 to be turned on in the first test stage and to be turned off in the second test stage after the first test stage is completed.

As illustrated in FIG. 2A, the first test control signal application circuit 520 includes a first test control signal pad 521, a first test signal pad 522, and a first test control signal bypass 523. The first test signal pad 522 is used to receive the first test signal. The first test control signal pad 521 and the first test control signal bypass 523 are respectively electrically connected to the control terminal of the first test switch circuit 510. The first test switch circuit 510 is used to be applied with a signal to control the first test switch circuit 510 to be turned on in the first test stage, so as to electrically connect the first test signal pad 522 to a corresponding data lead 14, and to control the first test switch circuit 510 to be turned off in the second test stage after the first test stage is completed, so as to disconnect the first test signal pad 522 from the corresponding data lead 14, thereby avoiding the signal crosstalk phenomenon.

Further, as illustrated in FIG. 2B, the first test control signal bypass 523 is configured to be able to be electrically connected to the external signal application circuit 70. For example, the external signal application circuit 70 is implemented as a test probe of an lighting test device, and the test probe is electrically connected to the first test control signal bypass 523 by pressing (for example, inserting a needle), so as to apply a control signal voltage, that can turn off the first test switch circuit 510, to the first test circuit 50 in the second test stage, thereby avoiding adverse effects such as signal crosstalk in the second test stage.

In the display substrate provided by the above embodiment, in the second test stage, the external signal application circuit 70 applies the control signal voltage, that can turn off the first test switch circuit 510, to the first test switch circuit 510 through the first test control signal bypass 523, so as to turn off the first test switch circuit 510 in the second test stage, so that the first test switch circuit 510 is in a designated state, thereby eliminating the crosstalk phenomenon of signals between different columns of the first test switch circuit 510 caused by the control signal of the first test switch circuit 510 being in a floating state and further eliminating the problem of vertical dark stripes in the display region, which is beneficial to improve the accuracy of the array test of the display panel and the product yield of the display panel.

Figure 3:
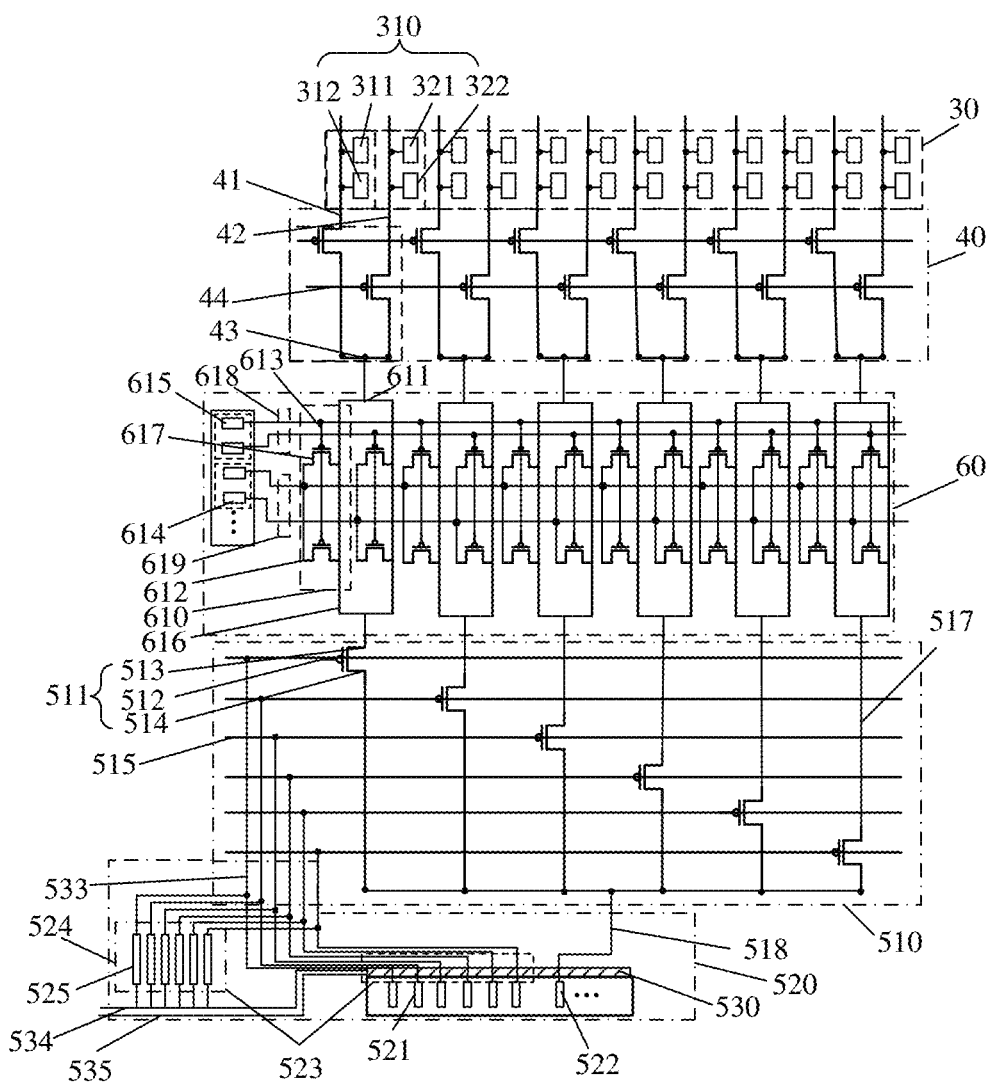
FIG. 3 is a schematic principle diagram of an example of the display substrate in FIG. 1 provided by an embodiment of the present disclosure.
Figure 4:
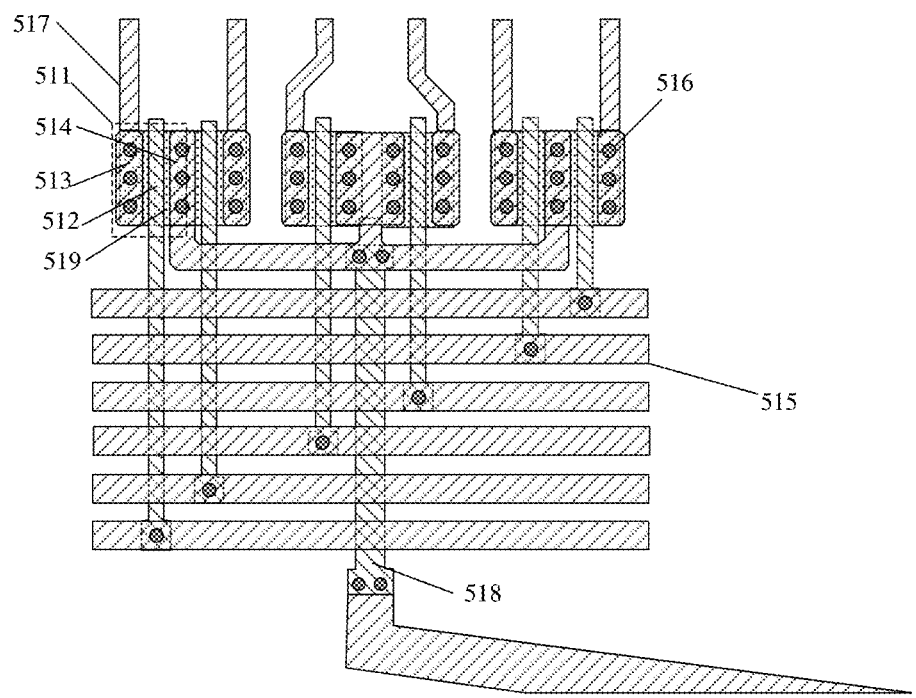
FIG. 4 is a schematic circuit diagram of a first test switch circuit in an area A2 in FIG. 1 provided by an embodiment of the present disclosure.

For example, FIG. 3 is a schematic principle diagram of an example of the display substrate in FIG. 1 provided by an embodiment of the present disclosure. FIG. 4 is a schematic circuit diagram of a first test switch circuit in an area A2 in FIG. 1 provided by an embodiment of the present disclosure.

As illustrated in FIG. 3 and FIG. 4, the first test switch circuit 510 includes a first test switch transistor 511 and a first test control signal line 515. For example, the first test switch transistors 511 and the first test control signal lines 515 are electrically connected in a one-to-one correspondence, and the total numbers of the first test switch transistors 511 and the first test control signal lines 515 are the same. A gate electrode 512 of each first test switch transistor 511 is electrically connected to one first test control signal line 515. The gate electrode 512 of the first test switch transistor 511 is used as the control terminal of the first test switch circuit 510. The first test control signal pad 521 is electrically connected to the gate electrode 512 of the first test switch transistor 511 through the first test control signal line 515, so as to provide a control signal, that can turn on the first test switch transistor 511, to the gate electrode 512 of the first test switch transistor 511 in the first test stage. For example, in the case where the first test switch transistor 511 is a P-type transistor, the control signal that is applied to the first test control signal pad 521 and can turn on the first test switch transistor 511 is a low-level signal, and accordingly, the control signal that is applied to the first test control signal pad 521 and can turn off the first test switch transistor 511 is a high-level signal (the level of the high-level signal is higher than the level of the low-level signal).

As illustrated in FIG. 3 and FIG. 4, the total number of the first test switch transistors 511 is equal to the total number of the first test control signal lines 515. FIG. 3 and FIG. 4 illustrate six first test switch transistors 511 and six corresponding first test control signal lines 515, which correspond to the plurality of columns of sub-pixels 310 in the display region 11. The embodiments of the present disclosure are not limited to the total number of the first test switch transistors 511 and the total number of the first test control signal lines 515.

For example, FIG. 4 illustrates the circuit structure of the first test switch transistor 511 and the first test control signal line 515 of the first test switch circuit 510. The six first test control signal lines 515 of the first test switch circuit 510 are arranged side by side in the horizontal direction, and each first test control signal line 515 is electrically connected to the gate electrode 512 of each first test switch transistor 511 to provide the control signal to the gate electrode 512 of the first test switch transistor 511. Two first test switch transistors 511 connected to two adjacent first test control signal lines 515 share one first test semiconductor layer 519, and different parts of the first test semiconductor layer 519 are used as respective active layers. For example, the two first test switch transistors 511 connected to the two first test control signal lines 515 at the lowest side (far away from the first test switch transistor 511) of FIG. 3 share one first test semiconductor layer 519 to reduce wiring space. That is, the two first test switch transistors 511 are arranged side by side as a group. The first test switch transistor 511 further includes a first electrode 513 and a second electrode 514. The first electrode 513 and the second electrode 514 are arranged side by side in the vertical direction, respectively located on two sides of the gate electrode 512 and electrically connected to the first test semiconductor layer 519. The two first test switch transistors 511 on both sides of FIG. 4 that share one first test semiconductor layer 519 share the same second electrode 514, and two second electrodes 514 of the two first test switch transistors 511 located in the middle of FIG. 4 are separately arranged.

FIG. 4 illustrates a plurality of vias 516 (represented by gray circles) for connecting components located on different layers together. For example, each of the first electrode 513 and the second electrode 514 of the first test switch transistor 511 are connected to the first test semiconductor layer 519 through three vias 516 (illustrated in FIG. 4). For another example, the gate electrode 512 of the first test switch transistor 511 is connected to the first test control signal line 515 through the via 516.

For example, as illustrated in FIG. 4, the first test switch circuit 510 further includes a first test signal line 517 and a second test signal line 518. For example, in FIG. 4, six first test signal lines 517 are electrically connected to the first electrodes 513 of six first test switch transistors 511, respectively. The total number of the first test signal lines 517 is the same as the total number of the first test switch transistors 511. The second test signal line 518 is electrically connected to the second electrodes 514 of the first test switch transistors 511 to provide a signal, such as a data signal, to the first test switch transistors 511.

It should be noted that the first electrode and the second electrode here respectively represent the source electrode and the drain electrode of the first test switch transistor 511; and, in different examples, the positions of the first electrode and the second electrode can be interchanged.

For example, in some examples, the total number of the first test control signal lines 515 is the same as the total number of the first test switch transistors 511. In other examples, the total number of the first test control signal lines 515 can also be changed to 5, 7, 8, etc. according to the design requirements of the display panel, and the embodiments of the present disclosure are not limited thereto.

For example, in the present embodiment, the first test switch transistor 511 is a P-type thin film transistor. Accordingly, in the case where a high-level signal is applied to the gate electrode of the first test switch transistor 511, the first test switch transistor 511 is turned off, and in the case where a low-level signal is applied to the gate electrode of the first test switch transistor 511, the first test switch transistor 511 is turned on. For example, in other embodiments, the first test switch transistor 511 may also be an N-type thin film transistor. In this case, in the case where a high-level signal is applied to the gate electrode of the first test switch transistor 511, the first test switch transistor 511 is turned on, and in the case where a low-level signal is applied to the gate electrode of the first test switch transistor 511, the first test switch transistor 511 is turned off.

For example, the material of the first test semiconductor layer 519 of the first test switch transistor 511 may include polysilicon, oxide semiconductor (for example, indium gallium zinc oxide), or amorphous silicon (a-Si:H). The first test switch transistor 511 may be a polysilicon thin film transistor, an oxide semiconductor thin film transistor, an amorphous silicon thin film transistor, or the like.

For example, in some examples, as illustrated in FIG. 2B and FIG. 3, the first test control signal bypass 523 includes a first voltage division circuit 524. A first terminal of the first voltage division circuit 524 is electrically connected to the first test control signal line 515, and a second terminal of the first voltage division circuit 524 is connected to the external signal application circuit 70 to provide the control signal, that can turn off the first test switch transistor 511, to the gate electrode 512 of the first test switch transistor 511 in the second test stage. For example, in the case where the first test switch transistor 511 is a P-type transistor and the voltage of the control signal of the external signal application circuit 70 is a high voltage, the first voltage division circuit 524 can divide the voltage to prevent the current generated by the control signal voltage from being too high, thereby protecting the first test switch circuit 510.

For example, in some examples, the control signal voltage selects a clock signal with a voltage range of approximately +6V to +8V, for example, a clock signal with a voltage of approximately +7V. It should be noted that the word "approximately" means that the value of the control signal voltage may be varied within a range of, for example, ±25% (for example, ±10%).

For example, as illustrated in FIG. 3, the first voltage division circuit 524 of the first test control signal bypass 523 includes at least one first resistor 525. The at least one first resistor 525 is electrically connected to the first test control signal line 515, and in the second test stage, the at least one first resistor 525 is further electrically connected to the external signal application circuit 70, so as to divide the voltage when transmitting the control signal voltage to the first test switch transistor 511 in the second test stage. For example, the first resistor 525 is made of a semiconductor material, for example, the first resistor 525 is formed of the same material in the same patterning process as the active layer of the first test switch transistor 511, and the first resistor 525 has electrical conductivity after being subjected to an ion doping process.

For example, in some examples, as illustrated in FIG. 3, the first test control signal bypass 523 further includes at least one first electrostatic discharge unit 530. The at least one first electrostatic discharge unit 530 is located on a side of the first test control signal pad 521 close to the first test switch circuit 510.

Figure 6A:
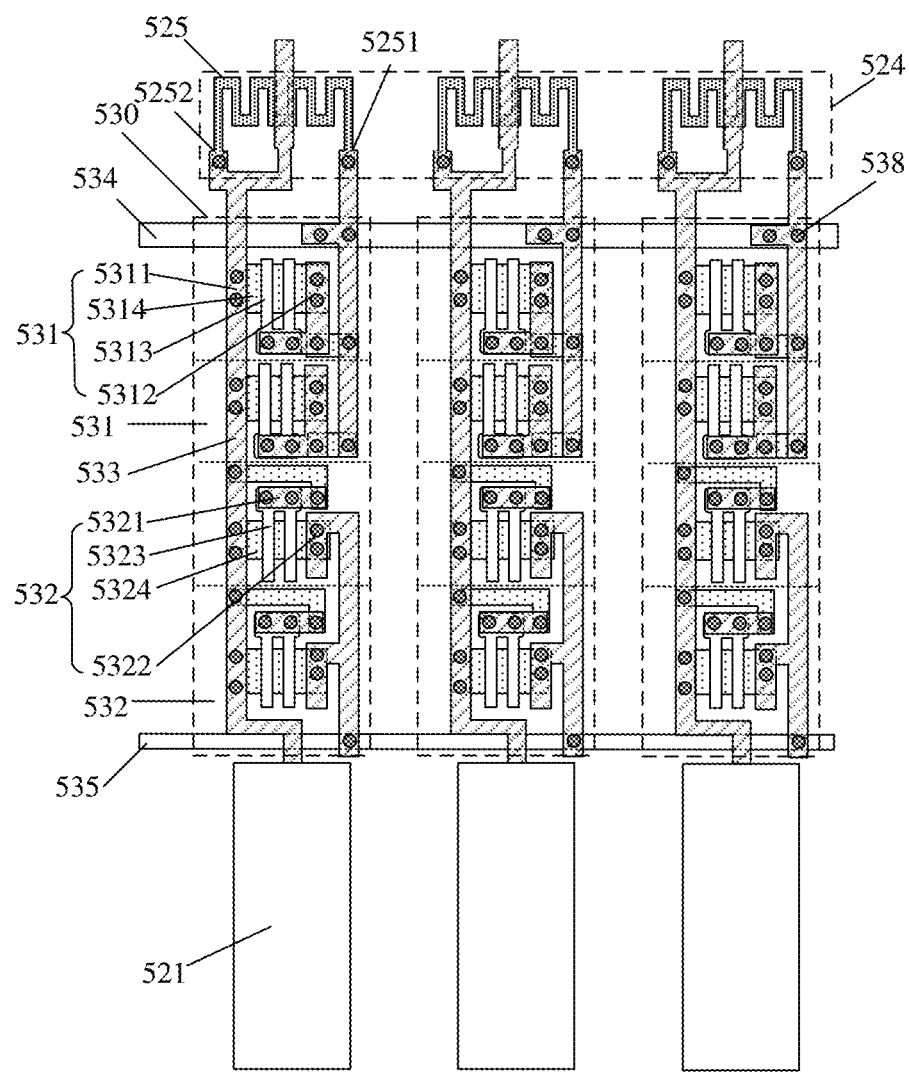
FIG. 6A is a schematic circuit diagram of a first test control signal bypass provided by an embodiment of the present disclosure.

FIG. 6A is a schematic circuit diagram of a first test control signal bypass provided by an embodiment of the present disclosure. As illustrated in FIG. 6A, the at least one first electrostatic discharge unit 530 is electrically connected to the first test control signal pad 521 in one-to-one correspondence. The first electrostatic discharge unit 530 is used to release static electricity in the first test circuit 50 to ensure the signal stability of the first test circuit 50. The first voltage division circuit 524 is located on a side of the first electrostatic discharge unit 530 away from the first test control signal pad 521 and is electrically connected to the first electrostatic discharge unit 530. A first terminal 5251 of the at least one first resistor 525 is electrically connected to a signal input terminal of the at least one first electrostatic discharge unit 530, that is, the first terminals 5251 of the first resistors 525 are electrically connected to signal input terminals of the first electrostatic discharge units 530 in one-to-one correspondence. A second terminal 5252 of the at least one first resistor 525 is electrically connected to the first test control signal line 515 through a data signal transmission line 533. The first test control signal pad 521 is also electrically connected to the first test control signal line 515 through the data signal transmission line 533 to reduce the wiring space, in addition, the static electricity can be released by the first electrostatic discharge unit 530.

Figure 5:
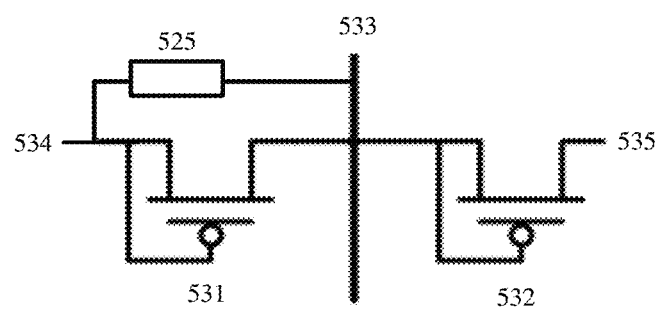
FIG. 5 is a schematic principle diagram of a first test control signal bypass provided by an embodiment of the present disclosure.

For example, in some examples, FIG. 5 is a schematic principle diagram of a first test control signal bypass provided by an embodiment of the present disclosure. As illustrated in FIG. 5, the first electrostatic discharge unit 530 includes a first thin film transistor 531, a second thin film transistor 532, a first signal line 534, and a second signal line 535. The first thin film transistor 531 is connected to the data signal transmission line 533 and the first signal line 534, respectively, and the second thin film transistor 532 is connected to the data signal transmission line 533 and the second signal line 535, respectively. For example, one of the source electrode and the drain electrode of the first thin film transistor 531 is selected to be electrically conducted to its gate electrode to form a diode structure to have unidirectional conduction characteristic; and one of the source electrode and the drain electrode of the second thin film transistor 532 is selected to be electrically conducted to its gate electrode to form a diode structure to have unidirectional conduction characteristic. The first signal line 534 and the second signal line 535 are configured to release positive and negative static charges on the data signal transmission line 533, respectively.

For example, as illustrated in FIG. 5, one of the first signal line 534 and the second signal line 535 is configured to release the negative static charges on the data signal transmission line 533, and the other of the first signal line 534 and the second signal line 535 is configured to release the positive static charges on the data signal transmission line 533. For example, the first signal line 534 is inputted with a high-level signal, and the first signal line 534 is a high-level signal line to release the positive static charges on the data signal transmission line 533. The second signal line 535 is inputted with a low-level signal, and the second signal line 535 is a low-level signal line to release the negative static charges on the data signal transmission line 533.

For example, in some examples, as illustrated in FIG. 3 and FIG. 6A, the at least one first resistor 525 of the first voltage division circuit 524 includes a plurality of first resistors 525, and the at least one first electrostatic discharge unit 530 includes a plurality of first electrostatic discharge units 530. The first terminal 5251 of each of the plurality of first resistors 525 is electrically connected to each of the plurality of first electrostatic discharge units 530, and the plurality of first electrostatic discharge units 530 are arranged side by side and respectively electrically connected to the first test control signal pads 521 through the data signal transmission lines 533. The second terminal 5252 of each of the plurality of first resistors 525 is electrically connected to one first test control signal line 515 through the data signal transmission line 533, and the plurality of first test control signal lines 515 connected to the plurality of first resistors 525 are respectively connected to the gate electrode 512 of the first test switch transistor 511 to provide the control signal voltage to the gate electrode 512 of the first test switch transistor 511.

Figure 6B:
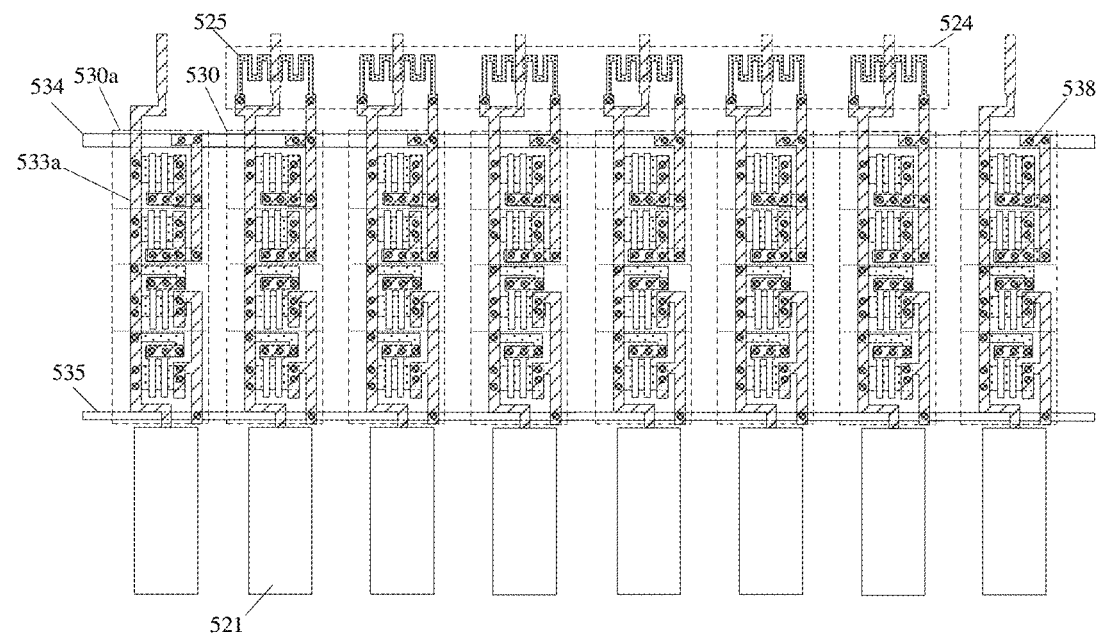
FIG. 6B is a schematic circuit diagram of a first test control signal bypass provided by another embodiment of the present disclosure.

For example, FIG. 6B is a schematic circuit diagram of a first test control signal bypass provided by another embodiment of the present disclosure, as illustrated in FIG. 6B, the total number of the plurality of first resistors 525 is six, and the total number of the plurality of first electrostatic discharge units 530 is six, so as to connect gate electrodes 512 of six first test switch transistors 511 respectively. For example, the plurality of first electrostatic discharge units 530 are electrically connected to each other through the first signal line 534 and the second signal line 535. By electrically connecting the first signal line 534 with the first electrostatic discharge unit 530, and by electrically connecting the second signal line 535 with the first electrostatic discharge unit 530, the static charges on the data signal transmission line 533 are released. In the present embodiment, the first resistor 525 is in lapped connection with the circuit of the first electrostatic discharge unit 530, which brings less change to the circuit structure of the display substrate, and also achieves the purpose of voltage division.

For example, in some examples, as illustrated in FIG. 6B, the second test circuit 50 further includes other virtual electrostatic discharge units 530a, and the virtual electrostatic discharge units 530a are not connected to the first resistor 515. The virtual electrostatic discharge units 530a are located on both sides of the column of the first electrostatic discharge unit 530 and are electrically connected to the first test control signal pads 521, respectively. It should be noted that the virtual electrostatic discharge units 530a are additional structures in consideration of the uniformity of the circuit, and the virtual electrostatic discharge units 530a do not work and are not connected to other wirings or circuits.

For example, in other embodiments, the total number of the plurality of first resistors 525, the total number of the plurality of first test control signal lines 515, and the total number of the plurality of first electrostatic discharge units 530 are equal to each other. The first terminals 5251 of the plurality of first resistors 525 are electrically connected to the plurality of first electrostatic discharge units 530 in one-to-one correspondence, and the second terminals 5252 of the plurality of first resistors 525 are electrically connected to the plurality of first test control signal lines 515 in one-to-one correspondence. For example, the total number of the plurality of first resistors 525, the total number of the plurality of first test control signal lines 515, and the total number of the plurality of first electrostatic discharge units 530 may also be 5, 7, 8, etc., and the embodiments of the present disclosure are not limited thereto.

For example, as illustrated in FIG. 6A, the first thin film transistor 531 includes a first electrode 5311 and a second electrode 5312. One of the first electrode 5311 and the second electrode 5312 is connected to the data signal transmission line 533, and the other of the first electrode 5311 and the second electrode 5312 is connected to the first signal line 534. The second thin film transistor 532 includes a third electrode 5321 and a fourth electrode 5322, one of the third electrode 5321 and the fourth electrode 5322 is connected to the data signal transmission line 533, and the other of the third electrode 5321 and the fourth electrode 5322 is connected to the second signal line 535. The data signal transmission line 533 crosses the first signal line 534 and the second signal line 535, respectively. The first thin film transistor 531 further includes a first gate electrode 5313, and one of the first electrode 5311 and the second electrode 5312 is electrically conducted to the first gate electrode 5313 to form a diode structure. The second thin film transistor 532 further includes a second gate electrode 5323, and one of the third electrode 5321 and the fourth electrode 5322 is electrically conducted to the second gate electrode 5323 to form a diode structure. The embodiments of the present disclosure take the case that the second electrode 5312 is electrically conducted to the first electrode 5313 and the fourth electrode 5322 is electrically conducted to the second electrode 5323 as examples for description. The first thin film transistor 531 further includes a first semiconductor layer 5314, and the first electrode 5311 and the second electrode 5312 are electrically connected to the first semiconductor layer 5314, respectively. The second thin film transistor 532 further includes a second semiconductor layer 5324, and the third electrode 5321 and the fourth electrode 5322 are electrically connected to the second semiconductor layer 5324, respectively.

FIG. 6A illustrates a plurality of vias 538 (illustrated in gray circles in FIG. 6A) for connecting components located on different layers together. For example, the first terminal 5251 of the first resistor 525 is connected to the first electrostatic discharge unit 530 through the vias 538, and the second terminal 5252 of the first resistor 525 is connected to the data signal transmission line 533 through the vias 538. For another example, the first electrode 5311 and the second electrode 5312 of the first thin film transistor 531 are connected to the first semiconductor layer 5314 through the vias 538, respectively.

For example, in some examples, as illustrated in FIG. 6A, the first electrostatic discharge unit 530 further includes two first thin film transistors 531, one first thin film transistor 531 is located on a side of the other first thin film transistor 531 away from the display region 11. Two second thin film transistors 532 are provided, one second thin film transistor 532 is located on a side of the other second thin film transistor 532 away from the display region 11. In order to improve the ability of the first electrostatic discharge unit 530 to discharge static charges, the two first thin film transistors 531 are connected in parallel to form a two-level protection; and the two second thin film transistors 532 are connected in parallel to form a two-level protection.

For example, as illustrated in FIG. 6A, the first terminal 5251 of the first resistor 525 is connected to the first signal line 534, and the second terminal 5252 of the first resistor 525 is connected to the data signal transmission line 533. The control signal voltage transmitted by the first signal line 534 is divided by the first resistor 525 and then transmitted to the first test switch circuit 510 through the data signal transmission line 533 to turn off the first test switch circuit 510 in the second test stage.

For example, in some examples, as illustrated in FIG. 2B, the second test circuit 60 includes at least one voltage application signal pad 620, the voltage application signal pad 620 is electrically connected to the first test control signal bypass 523, and the voltage application signal pad 620 is used to electrically connect to the external signal application circuit 70 in the second test stage. The first test control signal bypass 523 is configured to receive a control signal voltage and apply the control signal voltage, that can turn off the first test switch transistor 510, to the first test switch circuit 510. For example, the at least one voltage application signal pad 620 includes two voltage application signal pads 620, and one of the two voltage application signal pads 620 is connected to the first signal line 534 to transmit the control signal voltage to the first test switch circuit 510 in the second test stage, for example, the control signal voltage is a high-level signal. The other of the two voltage application signal pads 620 is connected to the second signal line 535 for transmitting a low-level signal and is used to release the static charges generated while the first test control signal pad 521 provides the first test control signal to the first test switch circuit 510 through the data signal transmission line 533 in the first test stage. In the second test stage, the test probes of the array test device are electrically connected to the voltage application signal pad 620 connected to the first signal line 534 in a manner of, for example, inserting a needle, so as to apply the control signal voltage, that can turn off the first test switch circuit 510, to the first test switch circuit 510.

For example, in some examples, as illustrated in FIG. 3 and FIG. 4, the first electrode 513 of the first test switch transistor 511 is electrically connected to the plurality of sub-pixels 310 through the first test signal line 517, and the second electrode 514 of the first test switch transistor 511 is configured to electrically connected to the first test signal pad 522 through the second test signal line 518. In the first test stage, the test probe of the array test device is used to contact the first test signal pad 522 to provide the first test signal for detecting the performance of the gate lines, data lines, etc. in the pixel array of the display substrate.

For example, in some examples, as illustrated in FIG. 1 and FIG. 3, the second test circuit 60 includes at least one second test switch circuit 610, and the at least one second test switch circuit 610 is located between the display region 110 and the signal access unit 20. A first terminal 611 of the second test switch circuit 610 is connected to the plurality of sub-pixels 310, a second terminal 612 of the second test switch circuit 610 is configured to receive a second test signal, and a control terminal of the second test switch circuit 610 is configured to receive a second test control signal to detect the performance of the pixel array 30 of the display substrate while displaying black and white images, monochrome images, and grayscale images.

For example, in some examples, as illustrated in FIG. 3, the at least one second test switch circuit 610 includes a plurality of second test switch circuits 610 arranged side by side in the horizontal direction. The first terminals 611 of the plurality of second test switch circuits 610 (illustrated in FIG. 3) are electrically connected to the plurality of sub-pixels 310 to reduce wiring space.

It should be noted that the second test circuit 60 may further include other second test switch circuits that are not electrically connected to the sub-pixel 310, and the embodiments of the present disclosure are not limited thereto.

For example, in some examples, as illustrated in FIG. 3, the second test circuit 60 further includes at least one second test signal pad 614 and at least one second test control signal pad 615. For example, the at least one second test signal pad 614 of the second test circuit 60 includes a plurality of second test signal pads 614, and the at least one second test control signal pad 615 of the second test circuit 60 includes a plurality of second test control signal pads 615. For example, the plurality of second test signal pads 614 and the plurality of second test control signal pads 615 are arranged in a column or a row. It should be noted that the positions and arrangement directions of the plurality of second test signal pads 614 and the plurality of second test control signal pads 615 illustrated in FIG. 3 are schematic for showing the connection relationship, and do not represent the positions and arrangement directions in the actual product.

For example, continuing as illustrated in FIG. 3, the first terminal 611 of the second test switch circuit 610 is configured to be connected to, for example, the plurality of sub-pixels 310 in one or more columns through the data lead 14 and the data line 13 to provide the second test signal. The second terminal 612 of the second test switch circuit 610 is configured to be electrically connected to the second test signal pad 614 to receive the second test signal (for example, a data signal for driving the sub-pixel 310 to emit light), and a control terminal 613 of the second test switch circuit 610 is configured to be electrically connected to the second test control signal pad 615 to receive the second test control signal. For example, in the second test stage, the test probe of the lighting test device is used to contact the second test signal pad 614 and the second test control signal pad 615 to provide the second test signal and the second test control signal.

Figure 7:
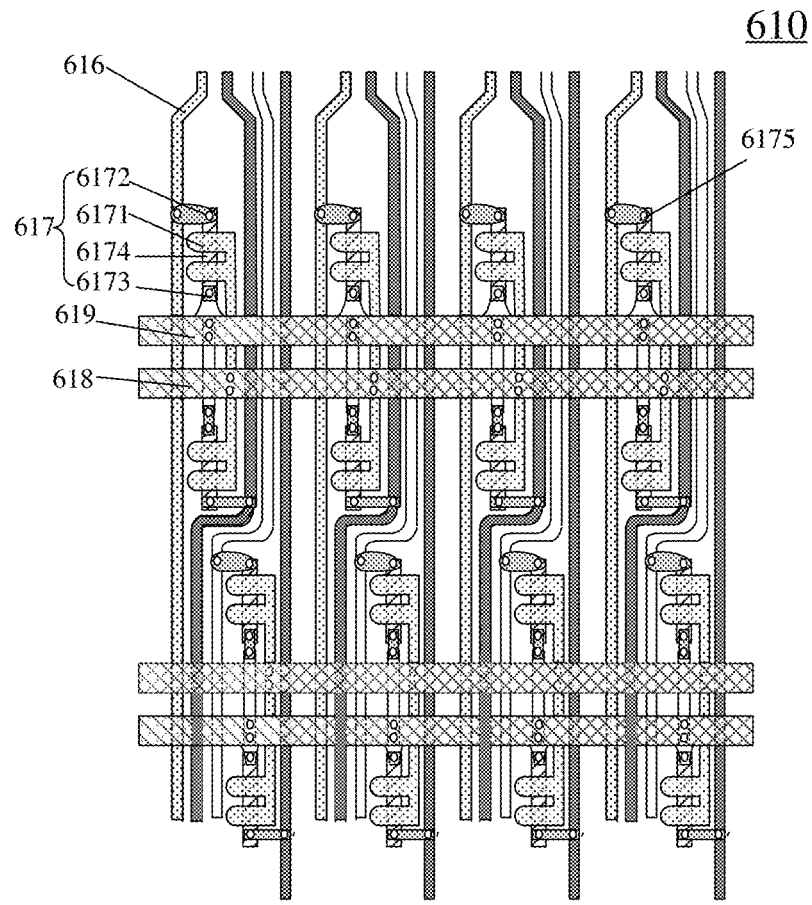
FIG. 7 is a schematic circuit diagram of a second test circuit in an area A3 in FIG. 1 provided by an embodiment of the present disclosure.

For example, as illustrated in FIG. 3 and FIG. 7, the second test circuit 60 further includes a test signal line 616. For example, as illustrated in the figures, there may be a plurality of test signal lines 616. The test signal lines 616 are arranged side by side in the vertical direction. The test signal line 616 is electrically connected to, for example, a plurality of sub-pixels 310 in one or more columns through the data lead 14 and the data line 13, and the test signal line 616 is further electrically connected to the first terminal 611 of the second test switch circuit 610 to receive the second test signal, and in turn transmits the second test signal to the plurality of sub-pixels 310 in one or more columns connected thereto through the data lead 14 and the data line 13. In addition, the test signal line 616 is further electrically connected to the first test circuit 50 to transmit the first test signal to the plurality of sub-pixels 310 in one or more columns connected thereto through the data lead 14 and the data line 13.

For example, as illustrated in FIG. 3 and FIG. 7, the second test switch circuit 610 includes at least one second test switch transistor 617. For example, the at least one second test transistor 617 includes two second test transistors 617 located in the same column in the vertical direction. In the embodiments of the present disclosure, one of the second test transistors 617 is taken as an example for description. The second test transistor 617 includes a gate electrode 6171, a semiconductor layer 6174, a first electrode 6172, and a second electrode 6173. The first electrode 6172 and the second electrode 6173 are connected to the semiconductor layer 6174 respectively. It should be noted that the first electrode 6172 and the second electrode 6173 respectively represent the source electrode and the drain electrode of the second test transistor 617, and in other embodiments, the first electrode 6172 and the second electrode 6173 can be interchanged in terms of positions, etc. The gate electrode 6171 of the second test transistor 617 is connected to the second test control signal line 618, and the second test control signal line 618 is further connected to the second test control signal pad 615 to provide the second test control signal to the second test transistor 617. The second electrode 6173 of the second test transistor 617 is connected to the second test data signal line 619, and the second test data signal line 619 is further connected to the second test signal pad 615 to provide the second test signal to the second test transistor 617. The first electrode 6172 of the second test transistor 617 is connected to the test signal line 616 to transmit the second test signal to the plurality of sub-pixels 310.

FIG. 7 illustrates a plurality of vias 6175 (illustrated in white circles in FIG. 7) for connecting components located on different layers together. For example, the first electrode 6172 and the second electrode 6173 of the second test transistor 617 are respectively connected to the semiconductor layer 6174 through the vias 6175, and the gate electrode 6171 of the second test transistor 617 is connected to the second test control signal line 618 through the vias 6175.

For example, in some examples, as illustrated in FIG. 3, the pixel array 30 further includes a first multiplex selection circuit 40. The first multiplex selection circuit 40 includes a first terminal 41, second terminal 42, a third terminal 43, and at least one control terminal 44. For example, at least one control terminal 44 includes two control terminals 44, the embodiments of the present disclosure are not limited thereto. The first multiplex selection circuit 40 is configured to electrically connect the first terminal 41 and the third terminal 43 or electrically connect the second terminal 42 and the third terminal 43 according to a control signal received by the control terminal 44. The first terminal 41 is electrically connected to the plurality of sub-pixels 310 located in the first column, so as to provide a data signal to the plurality of sub-pixels 310 located in the first column in the case where the first terminal 41 is electrically connected to the third terminal 43. The second terminal 42 is electrically connected to the plurality of sub-pixels 310 located in the second column, so as to provide a data signal to the plurality of sub-pixels 310 located in the second column in the case where the second terminal 42 is electrically connected to the third terminal 43. The data signal enables the sub-pixel 310 to emit light to display an image. For example, the data signal has a certain predetermined value, for example, corresponding to a gray scale such as 255 and 127. The third terminal 43 is electrically connected to the first test circuit 50 and the second test circuit 60 to provide the first test signal and the second test signal to the plurality of sub-pixels 310 in the first column or the second column in the case where the first terminal 41 is electrically connected to the third terminal 43 or the second terminal 42 is electrically connected to the third terminal 43.

For example, in some examples, as illustrated in FIG. 3, the plurality of sub-pixels 310 located in the first column include a first sub-pixel 311 and a second sub-pixel 312 that are adjacent to each other. The first sub-pixel 311 emits light of a first primary color, and the second sub-pixel 312 emits light of a second primary color. The plurality of sub-pixels 310 located in the second column includes a third sub-pixel 321 and a fourth sub-pixel 322 that are adjacent to each other, and the third sub-pixel 321 and the fourth sub-pixel 322 emit light of a third primary color. The first sub-pixel 311, the second sub-pixel 312, the third sub-pixel 321, and the fourth sub-pixel 322 constitute a pixel unit. For example, the light of the first primary color is a blue light, the light of the second primary color is red light, and the light of the third primary color is green light.

For example, in some examples, as illustrated in FIG. 3, each of the plurality of sub-pixels 310 includes a light-emitting element and a pixel circuit for driving the light-emitting element to emit light. For example, the pixel circuit generates a light-emitting drive current under the control of the data signal (including the first test signal, the second test signal, etc.) provided by the data line 13 and the scanning signal provided by the gate line 15, and the light-emitting drive current enables the light-emitting element to emit red light, green light, blue light, or white light, etc. For example, the pixel circuit includes a conventional 7T1C (i.e., seven transistors and one capacitor) pixel circuit, and the seven transistors include at least one switch transistor and one drive transistor. A gate electrode of the switch transistor is electrically connected to the gate line 15 to receive the scanning signal, and a source electrode or a drain electrode of the switch transistor is connected to the data line 13 to receive the data signal. In different embodiments, the pixel circuit may further include a compensation circuit, and the compensation circuit includes an internal compensation circuit or an external compensation circuit, and the compensation circuit may include a transistor, a capacitor, and the like. For example, the pixel circuit further includes a reset circuit, a light-emitting control circuit, a detection circuit, etc., as required. The embodiments of the present disclosure do not limit the type of the light-emitting element and the specific structure of the pixel circuit.

For example, the display substrate provided by the embodiments of the present disclosure may be a display substrate such as an organic light-emitting diode (OLED) display substrate or a quantum dot light-emitting diode (QLED) display substrate. Accordingly, the light-emitting element in the sub-pixel is an OLED and a QLED, the light-emitting element includes a light-emitting layer, and the embodiments of the present disclosure do not limit the specific type of the display substrate.

For example, in the case where the display substrate is the organic light-emitting diode (OLED) display substrate, the light-emitting layer may include small molecular organic materials or polymer molecular organic materials, may be fluorescent light-emitting materials or phosphorescent light-emitting materials, and may emit red light, green light, blue light, or may emit white light according to the design. For example, the light-emitting layer may include a plurality of light-emitting sublayers. Moreover, according to different actual needs, in different examples, the light-emitting element may further include functional layers such as an electron injection layer, an electron transport layer, a hole injection layer, a hole transport layer, and the like.

For example, in the case where the display substrate is the quantum dot light-emitting diode (QLED) display substrate, the light-emitting layer may include quantum dot materials, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots, etc. The particle size of the quantum dots is 2-20 nm.

Figure 8:
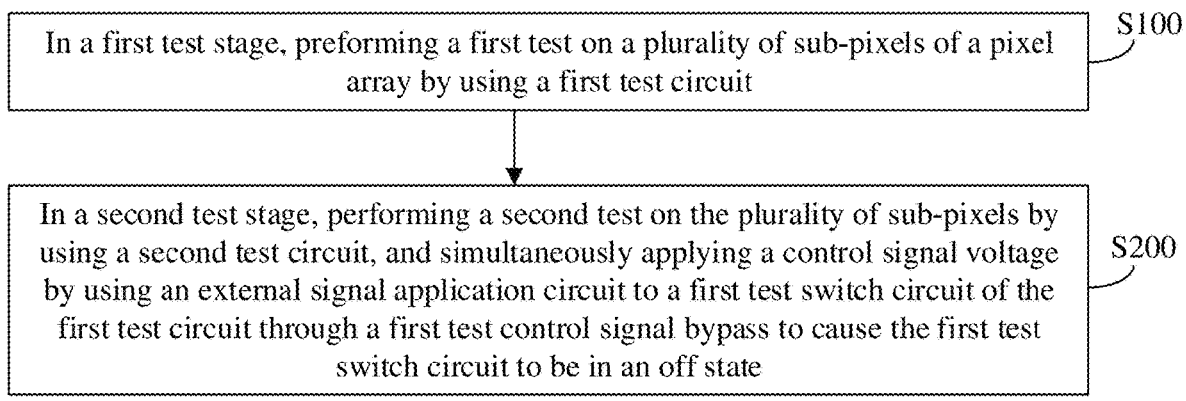
FIG. 8 is a procedure flowchart of a test method for a display substrate provided by an embodiment of the present disclosure.

At least one embodiment of the present disclosure further provides a test method for a display substrate. FIG. 8 is a procedure flowchart of a test method for a display substrate provided by an embodiment of the present disclosure, as illustrated in FIG. 8, the test method includes step S100 and step S200. The embodiments of the present disclosure do not limit the sequence of step S100 and step S200, that is, step S200 can be executed before step S100 or after it.

Step S100: in a first test stage, preforming a first test on a plurality of sub-pixels of a pixel array by using a first test circuit.

Step S200: in a second test stage, performing a second test on the plurality of sub-pixels by using a second test circuit, and simultaneously applying a control signal voltage by using an external signal application circuit to a first test switch circuit of the first test circuit through a first test control signal bypass to cause the first test switch circuit to be in an off state.

For example, in at least one example of the present disclosure, as illustrated in FIG. 1 and FIG. 3, the first test circuit 50 is electrically connected to the plurality of sub-pixels 310 through the plurality of data leads 14 and the plurality of data lines 13 that are electrically connected to each other. The first test circuit 50 includes the first test switch circuit 510 and the first test control signal application circuit 520. The first test control signal application circuit 520 includes the first test control signal pad 521 and the first test signal pad 522. The first test control signal pad 521 is electrically connected to the control terminal of the first test switch circuit 510 through the first test control signal line 515, and the first test signal pad 522 is electrically connected to the first test switch circuit 510 through the second test signal line 518.

The pixel array 30 further includes the first multiplex selection circuit 40. The first terminal 41 and the second terminal 42 of the first multiplex selection circuit 40 are electrically connected to the sub-pixels 310 located in different columns, respectively, and the third terminal 43 of the first multiplex selection circuit 40 is electrically connected to the test signal line 616 of the second test circuit 60. The control terminal 44 of the first multiplex selection circuit 40 is configured to receive a control signal, so that the first multiplex selection circuit 40 electrically connects the first terminal 41 to the third terminal 43 or electrically connects the second terminal 42 to the third terminal 43 according to the control signal received by the control terminal 44, in this way, corresponding signals, such as data signals, can be applied to the plurality of sub-pixels 310.

In the first test stage, the test probes of the array test device are used to contact the first test control signal pad 521 and the first test signal pad 522, so as to provide the first test control signal and the first test signal to the first test switch circuit 510 in the first test stage. Accordingly, the first multiplex selection circuit 40 is turned on under the control of the control signal received by the control terminal 44 to allow the first test signal to be applied to the data line 13 in the pixel array 30, in this way, the characteristics of the plurality of sub-pixels 310 of the display substrate can be detected, thereby performing the first test.

For example, in the present example, as illustrated in FIG. 2B and FIG. 3, the first test control signal bypass 523 is configured to be electrically connected to the external signal application circuit 70. The second test circuit 60 includes at least one second test switch circuit 610, the second test signal pad 614, and the second test control signal pad 615. The first terminal 611 of the second test switch circuit 610 is connected to the third terminal 43 of the first multiplex selection circuit 40 through the test signal line 616, and is further connected to the plurality of sub-pixels 310, and the second terminal 612 of the second test switch circuit 610 is configured to be electrically connected to the second test signal pad 614 to receive the second test signal. The control terminal 613 of the second test switch circuit 610 is configured to be electrically connected to the second test control signal pad 615 to receive the second test control signal.

In the second test stage, for example, the external signal application circuit 70 is implemented as the test probe of the lighting test device, and the test probe is in contact with the first test control signal bypass 523 to apply a control signal voltage, that can turn off the first test switch circuit 510, to the first test circuit 50. At the same time, the test probe of the lighting test device is further in contact with the second test signal pad 614 and the second test control signal pad 615 to provide the second test signal and the second test control signal. Accordingly, the first multiplex selection circuit 40 is turned on under the control of the control signal received by the control terminal 44 to allow the second test signal to be applied to the data line 13 in the pixel array 30 to detect the display characteristics of the display region 11, thereby performing the second test.

In the test method for the display substrate provided by at least one embodiment of the present disclosure, in the second test stage, the control signal voltage is applied to the first test switch circuit of the first test circuit through the first test control signal bypass, so that the first test circuit is in an off state, thereby eliminating the crosstalk phenomenon of signals between different columns of the first test switch circuit caused by the control signal of the first test switch circuit being in a floating state and further eliminating the problem of vertical dark stripes in the display region, which is beneficial to improve the accuracy of the array test of the display panel and the product yield of the display panel.

For example, in some examples of the present disclosure, the test method further includes: in the second test stage, electrically connecting the external signal application circuit and the voltage application signal pad of the second test circuit, and transmitting the control signal voltage to the first test control signal bypass. The voltage application signal pad is electrically connected to the first test control signal bypass, so that the control signal voltage applied on the voltage application signal pad can be transmitted to the first test control signal bypass.

For example, in the present example, as illustrated in FIG. 2B and FIG. 7, the second test circuit 60 includes the voltage application signal pad 620, the voltage application signal pad 620 is electrically connected to the first test control signal bypass 523, and the voltage application signal pad 620 is used to electrically connect to the external signal application circuit 70 in the second test stage. The first test control signal bypass 523 is configured to receive the control signal voltage and apply the control signal voltage, that can turn off the first test switch circuit 510, to the first test switch circuit 510. In the second test stage, the test probes of the array test device contact the voltage application signal pad 620 in a manner of, for example, inserting a needle, so as to apply the control signal voltage, that can turn off the first test switch circuit 510, to the first test switch circuit 510.

The display substrate involved in the embodiments of the present disclosure is a motherboard after the pixel array is manufactured and before the cutting process is performed during the manufacturing process. After the display substrate is subjected to the test process, the module assembly process, etc., the cutting process is performed to manufacture the display panel for the final product.

The following should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined as a new embodiment.

What is described above is related to the exemplary embodiments of the disclosure only, but the protection scope of the present disclosure is not limited to this. Any ordinary person skilled in the art can easily construct changes or substitutions within the technical scope disclosed in the present disclosure, and these changes or substitutions shall be encompassed by the protection scope of this disclosure.

Accordingly, the protection scope of the disclosure should be defined by the accompanying claims.

What is claimed is:

1. A display substrate, comprising:
a base substrate, comprising a display region and a peripheral region, wherein the peripheral region is located on at least one side of the display region, the display region comprises a pixel array, and the pixel array comprises a plurality of sub-pixels;
a plurality of data lines, located in the display region and configured to be respectively electrically connected to the plurality of sub-pixels to respectively provide a data signal to the plurality of sub-pixels;
a plurality of data leads, located in the peripheral region and respectively electrically connected to the plurality of data lines;
a first test circuit, located in the peripheral region and located on a side of the plurality of data leads away from the display region, and electrically connected to the plurality of data leads, wherein the first test circuit is configured to apply a first test signal to the plurality of sub-pixels to perform a first test in a first test stage; and
a second test circuit, electrically connected to the first test circuit and the plurality of data leads, wherein the second test circuit is configured to apply a second test signal to the plurality of sub-pixels to perform a second test in a second test stage,
wherein the first test circuit comprises a first test switch circuit and a first test control signal application circuit, the first test control signal application circuit comprises a first test control signal pad and a first test control signal bypass,
the first test control signal pad and the first test control signal bypass are respectively electrically connected to a control terminal of the first test switch circuit, and
the first test control signal bypass is configured to be electrically connected to an external signal application circuit,
wherein the first test switch circuit comprises a first test switch transistor and a first test control signal line,
the first test control signal pad is electrically connected to a gate electrode of the first test switch transistor through the first test control signal line, and the gate electrode of the first test switch transistor is used as the control terminal of the first test switch circuit; and
the first test control signal bypass comprises a first voltage division circuit, a first terminal of the first voltage division circuit is electrically connected to the first test control signal line, and a second terminal of the first voltage division circuit is electrically connected to the external signal application circuit,
wherein the first voltage division circuit of the first test control signal bypass comprises at least one first resistor; a second terminal of the at least one first resistor is electrically connected to the first test control signal line through a data signal transmission line; the first test control signal pad is also electrically connected to the first test control signal line through the data signal transmission line.

2. The display substrate according to claim 1, wherein the first test control signal bypass further comprises at least one first electrostatic discharge unit, the at least one first electrostatic discharge unit is located on a side of the first test control signal pad close to the first test switch circuit,
the first test control signal pad is electrically connected to the first electrostatic discharge unit, and
the first voltage division circuit is located on a side of the first electrostatic discharge unit away from the first test control signal pad and is electrically connected to the first electrostatic discharge unit.

3. The display substrate according to claim 2, wherein the first voltage division circuit comprises at least one first resistor,
a first terminal of the at least one first resistor is electrically connected to a data signal input terminal of the at least one first electrostatic discharge unit, and a second terminal of the at least one first resistor is electrically connected to the first test control signal line through a data signal transmission line.

4. The display substrate according to claim 3, wherein the first voltage division circuit the at least one first resistor comprises a plurality of first resistors, the first test control signal bypass comprises a plurality of first electrostatic discharge units,
the first terminal of each of the plurality of first resistors is electrically connected to each of the plurality of first electrostatic discharge units, and the plurality of first electrostatic discharge units are arranged side by side; and
the second terminal of each of the plurality of first resistors is electrically connected to the first test control signal line, and a plurality of the first test control signal lines connected to the plurality of first resistors are respectively electrically connected to the gate electrode of the first test switch transistor.

5. The display substrate according to claim 4, wherein a total number of the plurality of first resistors, a total number of the plurality of first test control signal lines, and a total number of the plurality of first electrostatic discharge units are equal to each other, first terminals of the plurality of first resistors are electrically connected to the plurality of first electrostatic discharge units in one-to-one correspondence, and second terminals of the plurality of first resistors are electrically connected to the plurality of first test control signal lines in one-to-one correspondence.

6. The display substrate according to claim 1, wherein the first test switch transistor is a P-type thin film transistor or an N-type thin film transistor, and
the external signal application circuit is used for applying a control signal voltage for turning off the first test switch transistor, so that the second test circuit is capable of turning off the first test switch circuit when the second test circuit is working.

7. The display substrate according to claim 6, wherein the second test circuit comprises at least one voltage application signal pad,
the at least one voltage application signal pad is electrically connected to the first test control signal bypass, and the at least one voltage application signal pad is used to electrically connect to the external signal application circuit in the second test stage; and
the first test control signal bypass is configured to receive the control signal voltage and apply the control signal voltage for turning off the first test switch transistor to the first test switch circuit.

8. The display substrate according to claim 1, wherein the first test control signal application circuit further comprises a first test signal pad,
a first electrode of the first test switch transistor is electrically connected to the plurality of sub-pixels, and a second electrode of the first test switch transistor is configured to be electrically connected to the first test signal pad.

9. The display substrate according to claim 1, wherein the second test circuit comprises at least one second test switch circuit,
  a first terminal of the second test switch circuit is connected to the plurality of sub-pixels, a second terminal of the second test switch circuit is configured to receive the second test signal, and a control terminal of the second test switch circuit is configured to receive a second test control signal.

10. The display substrate according to claim 9, wherein the second test circuit further comprises at least one second test signal pad and at least one second test control signal pad,
  the first terminal of the second test switch circuit is configured to be connected to the plurality of sub-pixels to provide the second test signal,
  the second terminal of the second test switch circuit is configured to be electrically connected to the second test signal pad to receive the second test signal, and
  the control terminal of the second test switch circuit is configured to be electrically connected to the second test control signal pad to receive the second test control signal.

11. The display substrate according to claim 9, wherein the second test circuit further comprises a test signal line,
  the test signal line is electrically connected to the plurality of sub-pixels, and the test signal line is further electrically connected to the first terminal of the second test switch circuit to receive the second test signal, and then the second test signal is transmitted to the plurality of sub-pixels.

12. The display substrate according to claim 11, wherein the test signal line is further electrically connected to the first test circuit to transmit the first test signal to the plurality of sub-pixels.

13. The display substrate according to claim 11, wherein the at least one second test switch circuit comprises a plurality of second test switch circuits,
  first terminals of the plurality of second test switch circuits are electrically connected to the plurality of sub-pixels respectively through the test signal line, and
  the plurality of second test switch circuits are located in a same column.

14. The display substrate according to claim 1, wherein the pixel array further comprises a first multiplex selection circuit,
  the first multiplex selection circuit comprises a first terminal, a second terminal, a third terminal, and at least one control terminal, and the first multiplex selection circuit is configured to electrically connect the first terminal of the first multiplex selection circuit and the third terminal of the first multiplex selection circuit or electrically connect the second terminal of the first multiplex selection circuit and the third terminal of the first multiplex selection circuit according to a control signal received by the at least one control terminal; and
  the first terminal of the first multiplex selection circuit is electrically connected to a plurality of sub-pixels located in a first column, the second terminal of the first multiplex selection circuit is electrically connected to a plurality of sub-pixels located in a second column, and the third terminal of the first multiplex selection circuit is electrically connected to each of the first test circuit and the second test circuit.

15. The display substrate according to claim 14, wherein the plurality of sub- pixels located in the first column comprise a first sub-pixel and a second sub-pixel adjacent to each other, the first sub-pixel emits light of a first primary color, and the second sub-pixel emits light of a second primary color; and
  the plurality of sub-pixels located in the second column comprise a third sub-pixel and a fourth sub-pixel adjacent to each other, and the third sub-pixel and the fourth sub-pixel emit light of a third primary color,
  wherein the first sub-pixel, the second sub-pixel, the third sub-pixel, and the fourth sub- pixel constitute a pixel unit.

16. A test method for the display substrate of claim 1, comprising:
  in a first test stage, preforming a first test on a plurality of sub-pixels of a pixel array by using a first test circuit; and
  in a second test stage, performing a second test on the plurality of sub-pixels by using a second test circuit, and simultaneously applying a control signal voltage by using an external signal application circuit to apply a control signal voltage to a first test switch circuit of the first test circuit through a first test control signal bypass to cause the first test switch circuit to be in an off state.

17. The test method according to claim 16, further comprising:
  in the second test stage, electrically connecting the external signal application circuit and a voltage application signal pad of the second test circuit; and
  transmitting the control signal voltage to the first test control signal bypass,
  wherein the voltage application signal pad is electrically connected to the first test control signal bypass.

18. The display substrate according to claim 2, wherein the first test switch transistor is a P-type thin film transistor or an N-type thin film transistor, and
  the external signal application circuit is used for applying a control signal voltage for turning off the first test switch transistor, so that the second test circuit is capable of turning off the first test switch circuit when the second test circuit is working.

19. The display substrate according to claim 3, wherein the first test switch transistor is a P-type thin film transistor or an N-type thin film transistor, and
  the external signal application circuit is used for applying a control signal voltage for turning off the first test switch transistor, so that the second test circuit is capable of turning off the first test switch circuit when the second test circuit is working.

* * * * *